United States Patent
Bode et al.

(10) Patent No.: US 9,300,302 B2
(45) Date of Patent: Mar. 29, 2016

(54) OSCILLATOR CIRCUIT, A SEMICONDUCTOR DEVICE AND AN APPARATUS

(75) Inventors: Hubert Bode, Haar (DE); Mathieu Lesbats, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/395,522

(22) PCT Filed: Apr. 20, 2012

(86) PCT No.: PCT/IB2012/051993
§ 371 (c)(1),
(2), (4) Date: Oct. 20, 2014

(87) PCT Pub. No.: WO2013/156821
PCT Pub. Date: Oct. 24, 2013

(65) Prior Publication Data
US 2015/0061780 A1    Mar. 5, 2015

(51) Int. Cl.
*H03K 3/0231* (2006.01)
*H03K 4/50* (2006.01)
*H03L 7/06* (2006.01)

(52) U.S. Cl.
CPC ............. *H03L 7/06* (2013.01); *H03K 3/0231* (2013.01); *H03K 4/50* (2013.01)

(58) Field of Classification Search
CPC .......... H03K 3/0231; H03K 4/12; H03K 4/50
USPC ............................ 327/182; 331/111, 143, 153
See application file for complete search history.

(56) References Cited

U.S. PATENT DOCUMENTS

| | | | | |
|---|---|---|---|---|
| 4,623,852 A * | 11/1986 | Abou | ..................... | H03K 3/354 331/111 |
| 5,699,024 A | 12/1997 | Manlove et al. | | |
| 6,020,792 A | 2/2000 | Nolan et al. | | |
| 6,052,035 A * | 4/2000 | Nolan | .................. | H03K 3/0231 331/111 |
| 6,281,732 B1 * | 8/2001 | Mirow | ................... | H03K 3/011 327/182 |
| 6,456,170 B1 * | 9/2002 | Segawa | ................ | H03K 3/0231 327/50 |

(Continued)

OTHER PUBLICATIONS

International Search Report and Written Opinion correlating to PCT/IB2012/051993 dated Jan. 29, 2013.

*Primary Examiner* — Levi Gannon

(57) ABSTRACT

An oscillator circuit for providing an output clock signal is described. The oscillator circuit comprising a voltage reference, a first current source, first capacitor, first capacitor switch, second current source, second capacitor, second capacitor switch, first comparator, second comparator and flip-flop. The first comparator comprises a first chopper-stabilized comparator switchable between a compare phase and a zeroing phase in dependence on the output clock signal and arranged to operate in the compare phase in a first half-phase of the output clock signal to provide a first comparator output from comparing the first capacitor voltage to the reference voltage and in the zeroing phase in the second half-phase. The second comparator comprises a second chopper-stabilized comparator switchable between a respective compare phase and a respective zeroing phase in dependence on the output clock signal and arranged to operate in its compare phase in the second half-phase to obtain a second comparator output from comparing the second capacitor voltage to the reference voltage and in its zeroing phase in the first half-phase.

12 Claims, 4 Drawing Sheets

(56) References Cited

U.S. PATENT DOCUMENTS

| | | | | |
|---|---|---|---|---|
| 7,034,627 | B1 * | 4/2006 | Kudari | H03K 3/0231 331/111 |
| 7,474,163 | B1 * | 1/2009 | Wile | H03K 3/017 331/143 |
| 9,007,137 | B2 * | 4/2015 | Inoue | H03K 3/36 327/182 |
| 2007/0103243 | A1 * | 5/2007 | Gong | H03K 3/0231 331/111 |
| 2010/0237955 | A1 | 9/2010 | Mahooti | |
| 2011/0050353 | A1 | 3/2011 | Zhu | |
| 2012/0182080 | A1 * | 7/2012 | Sinitsky | H03K 3/011 331/143 |
| 2014/0062596 | A1 * | 3/2014 | Glibbery | H03K 4/06 330/257 |

* cited by examiner

OSCILLATOR CIRCUIT, A SEMICONDUCTOR DEVICE AND AN APPARATUS

FIELD OF THE INVENTION

This invention relates to an oscillator circuit, a semiconductor device comprising an oscillator circuit and an apparatus comprising such semiconductor device.

BACKGROUND OF THE INVENTION

An embedded oscillator circuit often comprises a voltage reference, two capacitors charged by a current, one in each half-phase of the output clock, and two comparators which monitor at which time the voltage level on one of the capacitor nodes reaches the reference voltage. At that moment, the output clock is toggled and the other capacitor is charged. However, such embedded oscillator circuits usually suffer from output frequency variation, which may often prevent their use. Such output frequency variation may e.g. relate to variation between different semiconductor devices having embedded oscillator circuits that are designed to be substantially the same, but perform differently due to spread in their manufacturing, variation with temperature or variation over time. The variation may be present in the form of a temporary deviation or showing a long term frequency drift. While initial frequency offsets may be compensated by factory trim, frequency variation with temperature and frequency drift over time of usage may not be compensable by factory trim and may thus remain present. Such variations may be undesirable. Frequency tolerance requirements for some applications may already be too tight to be met with currently available embedded oscillator circuits, which may force a system designer to use external oscillators such as a quartz crystal oscillator.

FIG. 1 schematically shows an example of a prior art oscillator circuit 1P. The oscillator circuit 1P is arranged to provide an output clock signal CLK having an output frequency. The prior art oscillator circuit 1P will be described with further reference to FIG. 2. FIG. 2 schematically shows a time diagram the output clock signal CLK and voltages at nodes in the oscillator circuit. The oscillator circuit 1P comprises a voltage reference Vref, a first current source 11, a first capacitor 12, a first capacitor switch 13, a second current source 21, a second capacitor 22, a second capacitor switch 23, a first comparator 15P, a second comparator 25P and a flip-flop 30. The voltage reference Vref is provided from a reference current source 10 and a reference RC circuit 9 in a commonly known manner. The voltage reference Vref is arranged to carry a reference voltage. The symbol Vref will be used for the voltage reference as well as for the reference voltage in the further description. The first capacitor 12 is arranged to, by operation of the first capacitor switch 13, be chargeable by the first current source 11 to a first capacitor voltage Va on a first capacitor node 14 in a first half-phase P1 of the output clock cycle and to be dischargeable in a second half-phase P2 of the output clock cycle. The second capacitor 22 is arranged to, by operation of the second capacitor switch, be chargeable by the second current source to a second capacitor voltage Vb on a second capacitor node 24 in the second half-phase P2 of the output clock cycle and to be dischargeable in a first half-phase P1 of the output clock cycle. The first comparator 15P is arranged to provide a first comparator output 16 from continuously comparing the first capacitor voltage to the reference voltage. The second comparator 25 is arranged provide a second comparator output 26 from continuously comparing the second capacitor voltage to the reference voltage. The flip-flop being 30 is connected to the first comparator 15P and the second comparator 25P to receive the first comparator output 16 and the second comparator output 26 on its inputs and to generate the output clock signal CLK and an inverted output clock signal CLK* on its outputs. The flip-flop 30 is connected to the first comparator and the second comparator for operating the first capacitor switch 13 and the second capacitor switch 23 in dependency on respectively the output clock signal CLK and the inverted clock signal CLK*.

SUMMARY OF THE INVENTION

The present invention provides an oscillator circuit, a semiconductor device and an apparatus as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
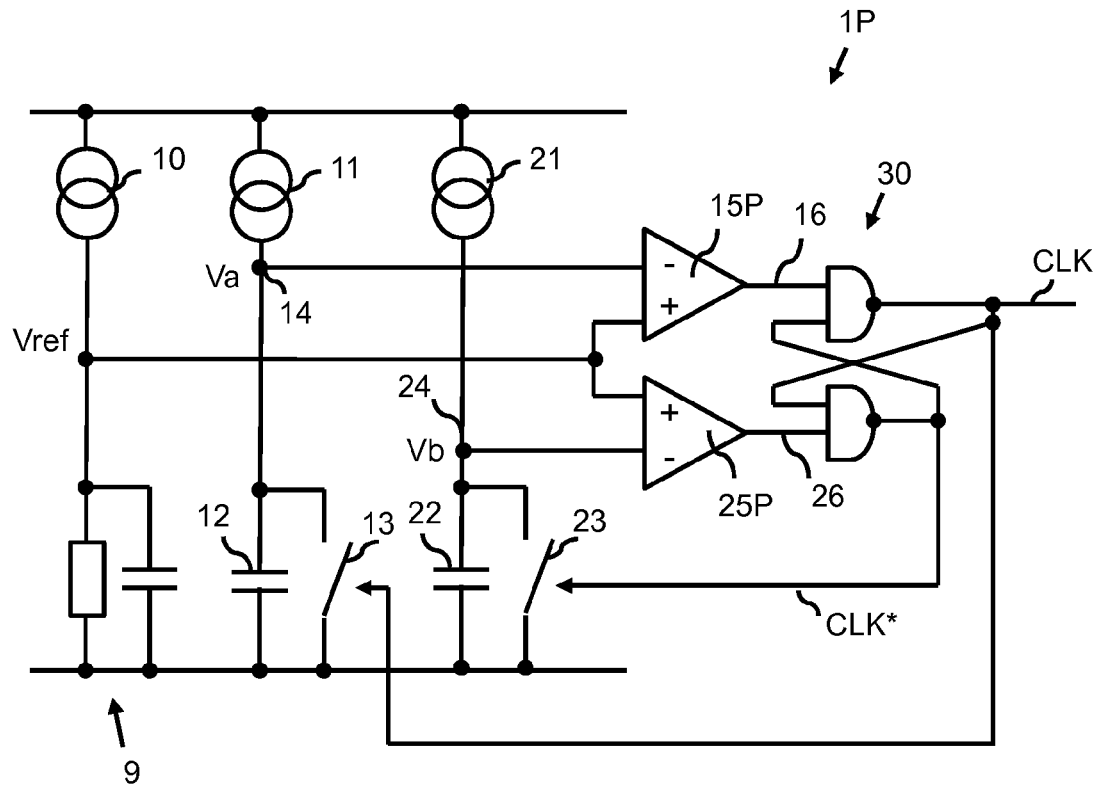
FIG. 1 schematically shows a circuit diagram of an example of a prior art oscillator.

A first example of an oscillator circuit for providing an output clock signal having an output frequency, comprises a voltage reference arranged to carry a reference voltage, a first current source, a first capacitor, a first capacitor switch, a second current source, a second capacitor, a second capacitor switch, a first comparator, a second comparator and a flip-flop.

The first capacitor may be arranged to, by operation of the first capacitor switch, be chargeable by the first current source to a first capacitor voltage on a first capacitor node in a first half-phase of the output clock and to be dischargeable in a second half-phase of the output clock. The second capacitor may be arranged to, by operation of the second capacitor switch, be chargeable by the second current source to a second capacitor voltage on a second capacitor node in the second half-phase of the output clock and to be dischargeable in a first half-phase of the output clock.

The first comparator can comprise a first chopper-stabilized comparator switchable between a compare phase and a zeroing phase in dependence on the output clock signal and arranged to operate in the compare phase in the first half-phase to provide a first comparator output from comparing the first capacitor voltage to the reference voltage and arranged to operate in the zeroing phase in the second half-phase.

The second comparator can comprise a second chopper-stabilized comparator switchable between a respective compare phase and a respective zeroing phase in dependence on the output clock signal and arranged to operate in its compare phase in the second half-phase to obtain a second comparator output from comparing the second capacitor voltage to the reference voltage and arranged to operate in its zeroing phase in the first half-phase phase;

The flip-flop can be connected to the first comparator and the second comparator to receive the first comparator output and the second comparator output for generating the output clock signal and connected to the first comparator and the second comparator for providing the output clock signal to the first comparator and the second comparator.

During the compare phase of the respective chopper-stabilized comparator of the first comparator and the second comparator, the respective comparator may hereby monitor which time the voltage level on the respective first or second capacitor reaches the reference voltage. During the zeroing phase of the respective chopper-stabilized comparator of the first comparator and the second comparator, the respective comparator may hereby be forced to a stage wherein any offset may be substantially zeroed. The first and second comparator's sensitivity to offset variation, such as offset variation over time, may hereby be largely reduced. The frequency stability of the oscillator circuit may hereby be improved.

During the zeroing phase of each comparator, the output of the comparator can be suppressed such that it cannot influence the state of the flip-flop.

The flip-flop may further be arranged to generate an inverted clock signal and may further be connected to the first comparator and the second comparator for providing the inverted output clock signal to the first comparator and the second comparator. The flip-flop may e.g. be an RS flip-flop.

For instance, as an example, each of the first comparator and the second comparator can comprise a respective delay unit for applying a delay to the respective comparator output before being provided to the flip-flop. Hereby, a transition time of the chopper-stabilized comparators to transit from the zeroing phase and the compare phase, and back, may be compensated. The flip-flop is hereby arranged to only toggle its state after the delay. The delay may be a pre-determined delay of a pre-determined duration or of a pre-determined fraction of the output clock period.

For instance, as an example, the oscillator circuit can comprise a first comparator input switch and a second comparator input switch, the first comparator input switch being arranged to provide the first chopper-stabilized comparator, during the first half-phase, with the first capacitor voltage and, during the second half-phase, with the reference voltage; and the second comparator input switch being arranged to provide the second chopper-stabilized comparator, during the second half-phase, with the second capacitor voltage and, during the first half-phase, with the reference voltage. The reference voltage may hereby be provided to one input of the respective chopper-stabilized comparator during the half-phase corresponding to the zeroing phase, while the second input is also provided with the reference voltage, whereby both inputs to the respective chopper-stabilized comparator may be forced substantially equal. Further, the respective capacitor voltage is provided to the respective chopper-stabilized comparator during the compare phase of the respective chopper-stabilized comparator.

In a further embodiment, the oscillator circuit can comprise a first reference voltage switch and a second voltage reference, the first reference voltage switch being arranged to provide the first chopper-stabilized comparator, during the first half-phase, with the reference voltage from a first voltage reference line and, during the second half-phase, with the reference voltage from a second voltage reference line; and the second reference voltage switch being arranged to provide the second chopper-stabilized comparator, during the second half-phase, with the reference voltage from a third voltage reference line and, during the first half-phase, with the reference voltage from a fourth voltage reference line. The first reference voltage switch may be switched simultaneously with the first comparator input switch. The second reference voltage switch may be switched simultaneously with the second comparator input switch. Hereby, switching currents induced by the switching of the first comparator input switch and the first reference voltage switch may be substantially symmetric to both inputs of the first chopper-stabilized comparator, and similarly for the second chopper-stabilized comparator. This may substantially prevent negative side-effects due to the switching.

For instance, as an example, the oscillator circuit can comprise first comparator input capacitors arranged at the inputs of the first chopper-stabilized comparator; and second comparator input capacitors arranged at the inputs of the second chopper-stabilized comparator. Hereby, capacitive coupling of the first and second capacitor voltage and the reference voltage to the inputs of the respective chopper-stabilized comparator may be obtained.

The first reference voltage switch and the second reference voltage switch may be arranged to, during the zeroing phase, connect one first comparator input capacitor and one second comparator input capacitor to the reference voltage. This may allow storing the reference voltages on one terminal of the one first comparator input capacitor and on one terminal of the one second comparator input capacitor during the zeroing phase. The first reference voltage switch and the second reference voltage switch may be arranged to, during the compare phase, connect the one first comparator input capacitor and the one second comparator input capacitor to the reference voltage. This may allow capacitive coupling of the reference voltage to the first chopper-stabilized comparator to the second chopper-stabilized comparator during the compare phase. The first comparator input switch and the second comparator input switch may be arranged to, during the compare phase, provide another first comparator input capacitor and another second comparator input capacitor with the first capacitor voltage and the second capacitor voltage respectively. This may allow capacitive coupling of the first second capacitor voltages to the first chopper-stabilized comparator and of the second capacitor voltages to the second chopper-stabilized comparator during the compare phase. The first comparator input switch and the second comparator input switch may be arranged to, during the zeroing phase, provide the another first comparator input capacitor and the another second comparator input capacitor with the reference voltage. This may allow storing the reference voltages on the another first comparator input capacitor and on the another second comparator input capacitor during the zeroing phase.

For instance, as an example, the oscillator circuit can comprise a zeroing voltage reference arranged to carry a zeroing voltage, the inputs of each chopper-stabilized comparator being switchable to the zeroing voltage reference. The zeroing voltage may hereby be provided to the inputs of the chopper-stabilized comparator during the zeroing phase, forcing its inputs to be substantially equal.

For instance, as an example, the zeroing voltage can be different from the reference voltage. The chopper-stabilized comparators may hereby be operated with the zeroing voltage during the zeroing phase different from the reference voltage, which may allow using an optimum value of the zeroing voltage for performing the zeroing and not being limited to the zeroing being performed with e.g. the reference voltage. For example, the zeroing voltage may be chosen to set the comparator's input stage to its optimum performance versus amplification and input offset.

For instance, as an example, the zeroing voltage can be in a range of 50-100% of the supply voltage of the first and second comparators, such as in a range of 50-75%, such as 66%. It has been found that a zeroing voltage in this range may be particularly suitable where, for example, the chopper-stabilized comparators have inputs with a source coupled pair of NMOS transistors. The supply voltage may be equal to the reference voltage. The supply voltage may alternatively be e.g. larger than the reference voltage.

For instance, as an example, each chopper-stabilized comparator can comprise a first amplifier stage and a second amplifier stage, the first amplifier stage comprising an amplifier for receiving differential input voltages and, in dependence on the differential input voltages, driving differential outputs to the second amplifier stage via intermediate coupling capacitors, the second stage arranged to provide the comparator output on its single-ended output. The total amplification of the comparator may thus be obtained from a two-stage amplification. The use of a first amplifier stage with differential outputs, driving the second amplifier stage via the intermediate coupling capacitors, may allow to substantially cancel offsets of the first amplifier stage. The second amplifier stage may substantially be a comparator. It will be appreciated that other suitable types of chopper-stabilized comparators may alternatively be used.

For instance, as an example, each chopper-stabilized comparator can comprise a plurality of zeroing switches operable to connect the inputs of the first amplifier stage and the inputs of the second amplifier stage to the zeroing voltage reference during the zeroing phase. Both inputs of the first amplifier stage and both inputs of the second amplifier stage may thus be connected to the zeroing voltage during the zeroing phase, and disconnected from the zeroing voltage during the compare phase. In embodiments having first comparator input capacitors and second comparator input capacitors, the zeroing switches may be arranged to, during the zeroing phase, charge the first comparator input capacitors arranged at the inputs of the first chopper-stabilized comparator and to charge the second comparator input capacitors arranged at the inputs of the second chopper-stabilized comparator. This may effectively set the compare threshold of the chopper stabilized comparators each time to the same level, the level being determined by the zeroing voltage. In embodiments having intermediate coupling capacitors, the zeroing switches may be arranged to, during the zeroing phase, store a voltage difference of the zeroing voltage and the offset voltage of the first amplifier stage on the intermediate capacitors. This may effectively allow storing of offset voltages on the intermediate capacitors.

For instance, as an example, the output frequency is in a range of 10 kHz-50 MHz. The output frequency may e.g. be in a range of 4-12 MHz, such as about 6 MHz, about 8 MHz or about 10 MHz. This may allow a wide range of applicability of the oscillator circuit according to embodiments described herein.

Another example provides a semiconductor device comprising an oscillator circuit according to any one embodiment. The oscillator circuit may thus be provided as an embedded circuit. The oscillator circuit may e.g. replace an external clock device, such as an external crystal. An improved level of integration with components on the semiconductor device may hereby be provided. The semiconductor device may e.g. comprise a microcontroller with the oscillator circuit being arranged to provide its output clock signal to the microcontroller. The microcontroller may e.g. be a microcontroller for embedded control applications with communication interfaces, e.g. in LIN or CAN networks.

Another example provides, an apparatus comprising a semiconductor device according to an embodiment. The apparatus may e.g. be a user device for mobile communication.

Figure 2:
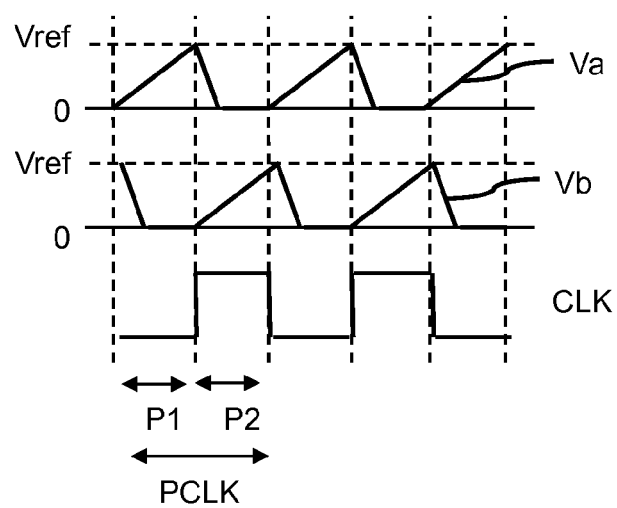
FIG. 2 schematically shows an example of typical waveforms during use of an oscillator.

FIG. 2 schematically shows an example of typical waveforms during use of such a prior art oscillator 1P. The output clock signal CLK has a clock cycle with a first half-phase P1 and a second half-phase P2. The oscillator circuit 1P is usually designed such that the first half-phase P1 and the second half-phase P2 have substantially equal duration. However, in practice, the first half-phase P1 and the second half-phase P2 may have different durations due to known and/or unknown factors. The duration of the first half-phase P1 and the duration of the second half-phase P2 together form period PCLK of the output clock signal CLK. During the first half-phase P1, the first capacitor switch 13 is open, i.e. non-conductive, whereby the first current source 11 charges the first capacitor 12 to obtain a first capacitor voltage Va on the first capacitor node 14. The first comparator 15P compares the first capacitor voltage Va to the reference voltage Vref. The second capacitor switch 23 is closed during the first half-phase P1, thereby shorting the second capacitor 22. The first comparator 15P and the second comparator 25P hereby monitor at which time the voltage level on one of the capacitor nodes reaches the reference voltage. At that moment, the output clock signal CLK and the inverted output clock signal CLK* is toggled and the first and second capacitor and the associated capacitor switches switch their roles.

Figure 3:
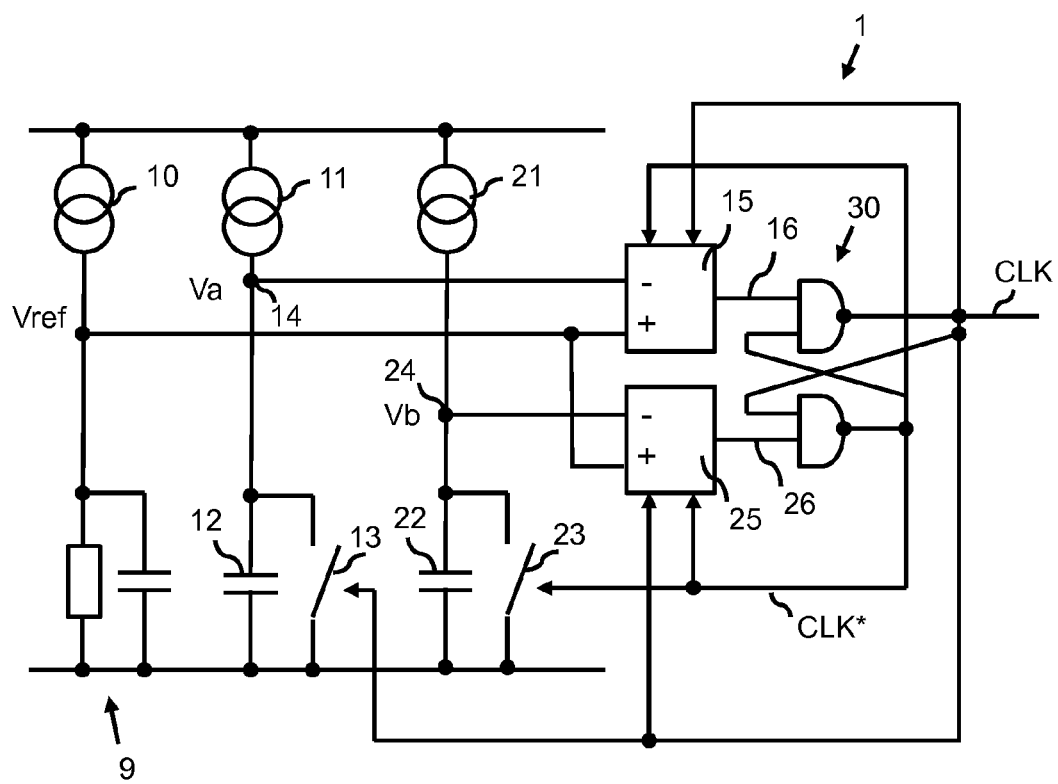
FIG. 3 schematically shows a circuit diagram of an example of an embodiment of an oscillator.

FIG. 3 schematically shows an example of an embodiment of an oscillator circuit 1. The oscillator circuit 1 again comprises a voltage reference Vref, a first current source 11, a first capacitor 12, a first capacitor switch 13, a second current source 21, a second capacitor 22, a second capacitor switch 23, a first comparator 15P, a second comparator 25P and a flip-flop 30. The voltage reference Vref is provided from a reference current source 10 and a reference RC circuit 9 in a commonly known manner. The voltage reference Vref is arranged to carry a reference voltage. The first capacitor 12 is arranged to, by operation of the first capacitor switch 13, be chargeable by the first current source 11 to a first capacitor voltage Va on a first capacitor node 14 in a first half-phase P1 of the output clock and to be dischargeable in a second half-phase P2 of the output clock. The second capacitor 22 is arranged to, by operation of the second capacitor switch, be chargeable by the second current source to a second capacitor voltage Vb on a second capacitor node 24 in the second half-phase P2 of the output clock and to be dischargeable in a first half-phase P1 of the output clock.

The flip-flop being 30 is connected to the first comparator 15 and the second comparator 25 to receive the first comparator output and the second comparator output on its inputs and to generate the output clock signal CLK and an inverted output clock signal CLK* on its outputs. The flip-flop 30 is connected to the first comparator and the second comparator for operating the first capacitor switch 13 and the second capacitor switch 23 in dependency on respectively the output clock signal CLK and the inverted clock signal CLK*.

The flip-flop 30 is further connected to the first comparator 15 and the second comparator 25 for providing the output clock signal CLK and the inverted output clock signal CLK* to the first comparator 15 and the second comparator 25.

The first comparator 15 comprises a first chopper-stabilized comparator 150 switchable between a compare phase and a zeroing phase in dependence on the output clock signal. The first chopper-stabilized comparator 150 is arranged to operate in the compare phase in the first half-phase to provide a first comparator output 16 from comparing the first capacitor voltage Va to the reference voltage Vref. The first chopper-stabilized comparator 150 is arranged to operate in the zeroing phase in the second half. The second comparator 25 comprises a second chopper-stabilized comparator 250 switchable between a respective compare phase and a respective zeroing phase in dependence on the output clock signal. The second chopper-stabilized comparator 250 is arranged to operate in its compare phase in the second half-phase to obtain a second comparator output 26 from comparing the second capacitor voltage Vb to the reference voltage Vref. The second chopper-stabilized comparator 250 is arranged to operate in its zeroing phase in the first half-phase phase. During the zeroing phase of a chopper-stabilized comparator 150 or 250, the respective comparator output 25 or 26 may be high-impedance, such as not to influence the flip-flop 30.

Figure 4:
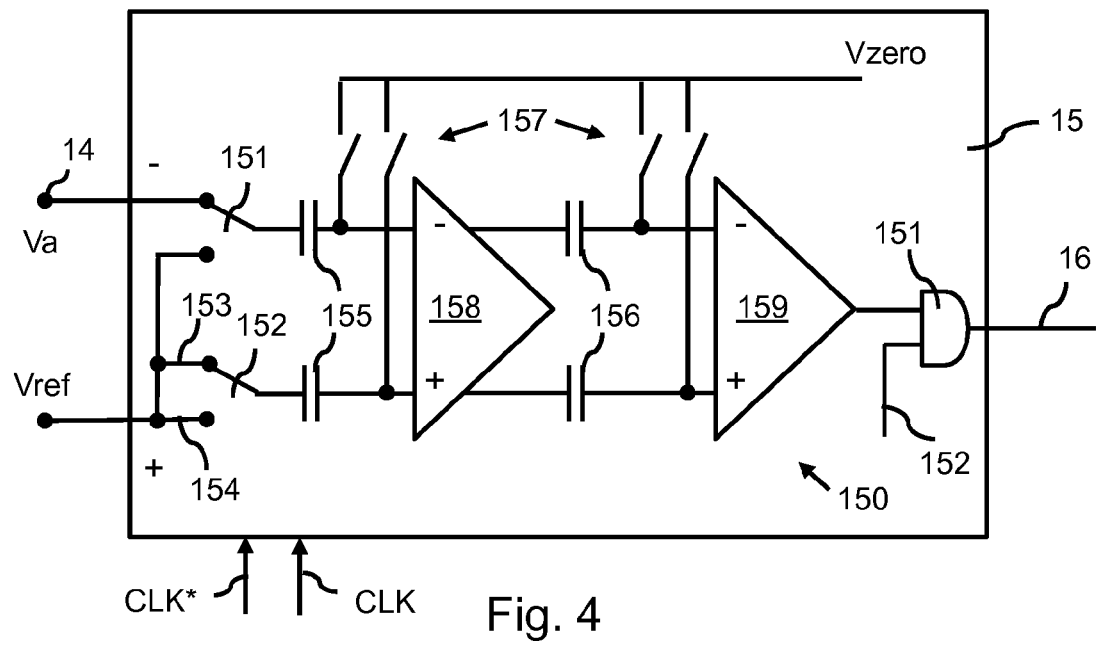
FIG. 4 and FIG. 5 schematically shows a circuit diagram of an example of an embodiment of a first comparator and a second comparator of an oscillator during use.
Figure 5:
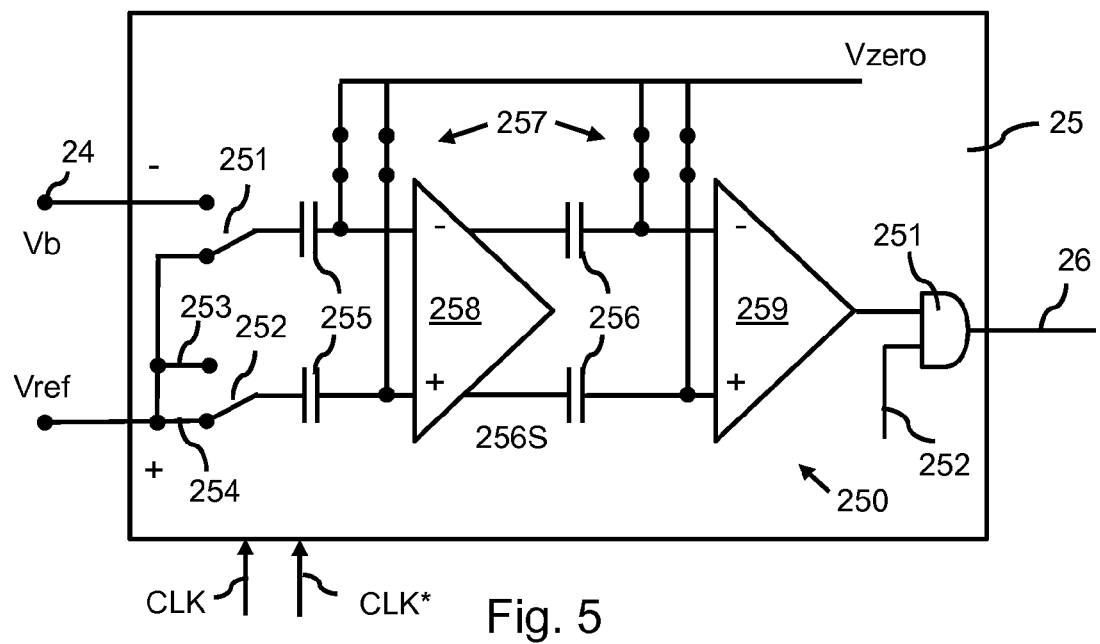

FIG. 4 schematically shows an example of an embodiment of a first comparator 15 of an oscillator and FIG. 5 schematically shows an example of an embodiment of a second comparator 25 of the oscillator of FIG. 4. The first comparator 15 is shown as operated during the first half-phase P1 of the output clock CLK. During the first half-phase P1 of the output clock CLK, the first chopper-stabilized comparator 150 is in the compare phase. The second comparator 25 is also shown as operated during the first half-phase P1 of the output clock CLK. During the first half-phase P1 of the output clock CLK, the second chopper-stabilized comparator 250 is in the zeroing phase. Thus, FIG. 4 and FIG. 5 schematically correspond to a first half-phase P1 of the output clock CLK.

The first comparator 15 comprises the chopper-stabilized comparator 150, a first comparator input switch 151, a first reference voltage switch 152, first comparator input capacitors 155, first intermediate coupling capacitors 156, a first amplifier stage 158, a second amplifier stage 159 and a first delay unit 151. The first comparator 15 further comprises a zeroing voltage reference Vzero arranged to carry a zeroing voltage Vzero, a first voltage reference line 153 arranged to carry the reference voltage Vref and a second voltage reference line 154 arranged to carry the reference voltage Vref. The first voltage reference line 153 and the second voltage reference line 154 both connect to the voltage reference Vref. The first amplifier stage 158 comprises an amplifier for receiving differential input voltages and, in dependence on the differential input voltages, driving differential outputs to the second amplifier stage 159 via upper and lower intermediate coupling capacitors 156. The second amplifier stage 159 has a single-ended output and is arranged to provide the first comparator output 16 on its single-ended output. The delay unit 151 is arranged to apply a delay in dependence on a delay signal 152 to the first comparator output before being provided to the flip-flop 30. The delay may e.g. correspond to a fraction in a range of 2% and 25% of the output clock period, such as 12% of the output clock period The delay signal 152 may be derived from the output clock period, or may be e.g. provided as a fixed delay, e.g. as a fixed RC delay.

The first comparator input capacitors 155, the first comparator input switch 151 and the first reference voltage switch 152 are arranged at the inputs of the first chopper-stabilized comparator 150. The first comparator input switch 151 can, in dependence on the output clock signal CLK, connect one input of the first chopper-stabilized comparator 150 via one first comparator input capacitor 155 (hereafter referred to as upper comparator input capacitor 155) to either the first capacitor node 14 or the reference voltage Vref. During use, the first comparator input switch 151 is operated to provide the first chopper-stabilized comparator 150 with the first capacitor voltage Va during the first half-phase, and to provide the first chopper-stabilized comparator 15 with the reference voltage Vref during the second half-phase. The first reference voltage switch 152 can, in dependence on the output clock signal CLK, connect the other input of the first chopper-stabilized comparator 150 via another first comparator input capacitor 155 (hereafter referred to as lower comparator input capacitor 155) to either the first voltage reference line 153 or the second voltage reference line 154 to provide the other input of the first chopper-stabilized comparator 150 with the reference voltage Vref. During use, the first reference voltage switch 152 is operated to provide the first chopper-stabilized comparator 150 with the reference voltage Vref from the first voltage reference line 153 during the first half-phase, and with the reference voltage Vref from the second voltage reference line 154 during the second half-phase. The first comparator input switch 151 and the first reference voltage switch 152 are operated simultaneously. Hereby, any current transients due to switching will be substantially symmetrical on both inputs of the first chopper-stabilized comparator 150, whereby negative side-effects of the switching may be prevented.

The first comparator 15 further comprises a plurality of zeroing switches 157. The plurality of zeroing switches 157 are operable to connect both inputs of the first amplifier stage 158 and both inputs of the second amplifier stage 159 to the zeroing voltage reference during the zeroing phase of the first chopper-stabilized comparator 150. Both inputs of the first amplifier stage 158 and both inputs of the second amplifier stage 159 are disconnected from to the zeroing voltage reference during the compare phase of the chopper-stabilized comparator 150.

The second comparator 25 comprises, in a corresponding arrangement as the first comparator 15, chopper-stabilized comparator 250, a second comparator input switch 251, a second reference voltage switch 252, second comparator input capacitors 255, second intermediate coupling capacitors 256, first amplifier stage 258, second amplifier stage 259, a second delay unit 152, a third first voltage reference line 253 arranged to carry the reference voltage Vref and a fourth voltage reference line 254 arranged to carry the reference voltage Vref. The third voltage reference line 253 and the fourth voltage reference line 254 both connect to the voltage reference Vref. Delay unit 251 is arranged to apply a delay in dependence on a delay signal 252 to the second comparator output 26 before being provided to the flip-flop 30.

The operation of the first comparator 15, operated alternatingly between the compare phase in the first half-phase P1 of the output clock CLK and the zeroing phase in the second half-phase P2 of the output clock CLK may be described as follows. The operation of the second comparator 25, operated alternatingly between the zeroing phase in the first half-phase P1 of the output clock CLK and the compare phase in the second half-phase P2 of the output clock CLK, is complementary and will be understood from the description of the operation of the first comparator 15 without any further discussion.

During the zeroing phase, zeroing switches 157 are closed, i.e. conducting. Hereby, a zeroing voltage Vzero is applied to both inputs of the first amplifier stage 158 and to both inputs of the second amplifier stage 159. During the zeroing phase, the first comparator input switch 151 connects one terminal of the upper comparator input capacitor 155 to the voltage reference Vref and a respective zeroing switch 157 connects the opposite terminal of the upper comparator input capacitor to Vzero. Hereby, the upper comparator input capacitor is charged to a value (Vzero Vref). During the zeroing phase, the first reference voltage switch 152 connects one terminal of the lower comparator input capacitor to the voltage reference Vref via the first voltage reference line 153 and a respective zeroing switch 157 connects the opposite terminal of the lower comparator input capacitor 155 to Vzero. Hereby, the lower comparator input capacitor 155 is charged to a value (Vzero−Vref). Further, the upper intermediate capacitor 156 is charged to a value (Vzero−Voffsetn) and the lower intermediate capacitor 156 is charged to a value (Vzero−Voffsetp), with Voffsetn and Voffsetp denoting the offset voltage of the negative and positive inputs of the first amplifier stage 158.

During the compare phase, zeroing switches 157 are open, i.e. non-conducting. During the compare phase, the first comparator input switch 151 connects one terminal of the upper comparator input capacitor 155 to the first capacitor node 14 to receive the first capacitor voltage Va. The opposite terminal of the upper comparator input capacitor 155 will thus provide a voltage (Va+Vzero−Vref) to the negative input of the first amplifier stage 158. During the compare phase, the first reference voltage switch 152 connects one terminal of the lower comparator input capacitor to the voltage reference Vref from the second voltage reference line 154. The opposite terminal of the lower comparator input capacitor 155 will thus provide a voltage (Vref+Vzero−Vref) to the positive input of the first amplifier stage 158. Hereby, the first amplifier stage 158 will be driven to provide a differential output corresponding to input voltages amplified with a first amplification factor Av. The upper differential output will thus drive the upper intermediate capacitor 156 to a voltage Vint_up=(Av*(Va+Vzero−Vref)+offsetn)+(Vzero−Voffsetn)=Av*(Va+Vzero−Vref)+Vzero, while the lower intermediate capacitor 156 will thus be at a voltage Vint_low=(Av*(Vref+Vzero−Vref)+offsetp)+(Vzero−Voffsetp)=Av*(Vref+Vzero−Vref)+Vzero.

The second amplifier stage 159 is thus provided at its negative input with voltage Av*(Va+Vzero−Vref)+Vzero and at its positive input with Av*(Vref+Verzo−Vref)+Vzero. The second amplifier stage 159 thus substantially compares Av*Va to Av*Vref and will cooperate with the flip-flop 30 to toffle the output clock CLK substantially when Va reaches Vref. Thus, the upper and lower intermediate capacitor 156 will add or subtract the offset voltage of the first stage before the voltages are provided to the second amplifier stage 159. Hereby, the offset of the first amplifier stage 158 may substantially be cancelled out.

The zeroing voltage Vzero may be two-third of a supply voltage Vsupply (not drawn). In other embodiments, the zeroing voltage Vzero may be another fraction of the reference voltage Vref, such as another fraction in a range of 25%-100% of Vsupply, in particular in a range of 50%-100% of Vsupply. Herein, Vsupply relates to the positive supply voltage of the first comparator 15 (and also of the second comparator 25). The supply voltage Vsupply may be equal or larger than the reference voltage Vref.

Figure 6:
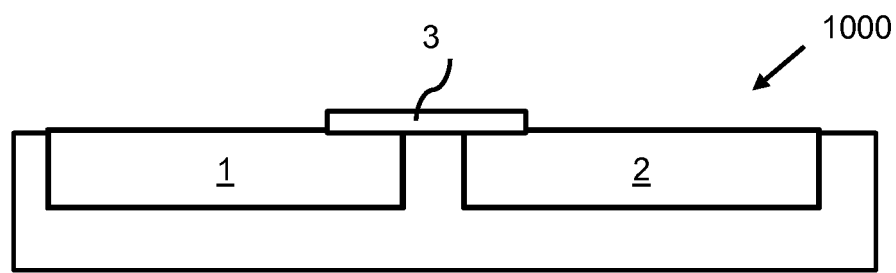
FIG. 6 schematically shows a cross-sectional view of an example of an embodiment of a semiconductor device.

FIG. 6 schematically shows an example of an embodiment of a semiconductor device 1000. The semiconductor device 1000 comprises an embedded oscillator circuit 1 according to an embodiment and further circuitry 2, also embedded with the semiconductor device 1000. The embedded oscillator circuit 1 is connected to the further circuitry 2 via a clock line 3, arranged to provide the further circuitry with its output clock signal CLK via the clock line 3. In an example, the further circuitry 2 comprises a microcontroller with the oscillator circuit 1 being arranged to provide its output clock signal to the microcontroller. The microcontroller may e.g. be a microcontroller for embedded control applications with communication interfaces, e.g. in LIN or CAN networks. In an alternative embodiment, the oscillator circuit 1 is part of the further circuitry.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors.

However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An oscillator circuit for providing an output clock signal having an output frequency, the oscillator circuit comprising a voltage reference, a first current source, a first capacitor, a first capacitor switch, a second current source, a second capacitor, a second capacitor switch, a first comparator, a second comparator and a flip-flop,
   the voltage reference arranged to carry a reference voltage,
   the first capacitor arranged to, by operation of the first capacitor switch, be chargeable by the first current source to a first capacitor voltage on a first capacitor node in a first half-phase of the output clock and to be dischargeable in a second half-phase of the output clock;
   the second capacitor arranged to, by operation of the second capacitor switch, be chargeable by the second current source to a second capacitor voltage on a second capacitor node in the second half-phase of the output clock and to be dischargeable in a first half-phase of the output clock;
   the first comparator comprising a first chopper-stabilized comparator switchable between a compare phase and a zeroing phase in dependence on the output clock signal and arranged to operate in the compare phase in the first half-phase to provide a first comparator output from comparing the first capacitor voltage to the reference voltage and arranged to operate in the zeroing phase in the second half-phase;
   the second comparator comprising a second chopper-stabilized comparator switchable between a respective compare phase and a respective zeroing phase in dependence on the output clock signal and arranged to operate in its compare phase in the second half-phase to obtain a second comparator output from comparing the second capacitor voltage to the reference voltage and arranged to operate in its zeroing phase in the first half-phase phase;
   the flip-flop being connected to the first comparator and the second comparator to receive the first comparator output and the second comparator output for generating the output clock signal and connected to the first comparator and the second comparator for providing the output clock signal to the first comparator and the second comparator;
   a zeroing voltage reference arranged to carry a zeroing voltage, the inputs of each chopper-stabilized comparator being switchable to the zeroing voltage reference.

2. An oscillator circuit according to claim 1, each of the first comparator and the second comparator comprising a respective delay unit for applying a delay to the respective comparator output before being provided to the flip-flop.

3. An oscillator circuit according to claim 1, comprising:
   a first comparator input switch arranged to provide the first chopper-stabilized comparator, during the first half-phase, with the first capacitor voltage and, during the second half-phase, with the reference voltage; and
   a second comparator input switch arranged to provide the second chopper-stabilized comparator, during the second half-phase, with the second capacitor voltage and, during the first half-phase, with the reference voltage.

4. An oscillator circuit according to claim 3, comprising:
   a first reference voltage switch arranged to provide the first chopper-stabilized comparator, during the first half-phase, with the reference voltage from a first voltage reference line and, during the second half-phase, with the reference voltage from a second voltage reference line; and
   a second reference voltage switch arranged to provide the second chopper-stabilized comparator, during the second half-phase, with the reference voltage from a third voltage reference line and, during the first half-phase, with the reference voltage from a fourth voltage reference line.

5. An oscillator circuit according to claim 1, comprising:
   first comparator input capacitors arranged at the inputs of the first chopper-stabilized comparator; and
   second comparator input capacitors arranged at the inputs of the second chopper-stabilized comparator.

6. An oscillator circuit according to claim 1, the zeroing voltage being different from the reference voltage.

7. An oscillator circuit according to claim 1, the zeroing voltage being in a range of 50-100% of a supply voltage of the first comparator and the second comparator.

8. An oscillator circuit according to claim 1, each chopper-stabilized comparator comprising a first amplifier stage and a second amplifier stage, the first amplifier stage comprising an amplifier for receiving differential input voltages and, in dependence on the differential input voltages, driving differential outputs to the second amplifier stage via intermediate coupling capacitors, the second stage arranged to provide the comparator output on its single-ended output.

9. An oscillator circuit according to claim 1, each chopper-stabilized comparator comprising a plurality of zeroing switches arranged to connect the inputs of the first amplifier stage and the inputs of the second amplifier stage to the zeroing voltage reference during the zeroing phase.

10. An oscillator circuit according to claim 1, the output frequency being in a range of 10 kHz-50 MHz.

11. A semiconductor device comprising an oscillator circuit according to claim 1.

12. An apparatus comprising a semiconductor device according to claim 11.

* * * * *